United States Patent
Backes et al.

(10) Patent No.: US 10,122,388 B2
(45) Date of Patent: Nov. 6, 2018

(54) AUTO-TUNABLE ANTENNA DEVICES

(71) Applicant: Honeywell International Inc., Morristown, NJ (US)

(72) Inventors: Glen Backes, Maple Grove, MN (US); Doug Carlson, Woodbury, MN (US); Robert C. Becker, Golden Valley, MN (US); Alan Cornett, Golden Valley, MN (US); Kelly Muldoon, Minneapolis, MN (US); Lisa Lust, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 31 days.

(21) Appl. No.: 14/563,808

(22) Filed: Dec. 8, 2014

(65) Prior Publication Data
US 2016/0164495 A1 Jun. 9, 2016

(51) Int. Cl.
*H04B 1/00* (2006.01)
*H03J 1/00* (2006.01)
*H03J 7/02* (2006.01)
*H03J 7/04* (2006.01)

(52) U.S. Cl.
CPC .......... *H04B 1/0053* (2013.01); *H03J 1/0008* (2013.01); *H03J 7/02* (2013.01); *H03J 7/04* (2013.01); *H03J 2200/06* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,353,037 | A * | 10/1982 | Miller | H03F 1/52 330/207 P |
| 5,491,715 | A * | 2/1996 | Flaxl | G06K 7/0008 333/17.3 |
| 5,909,129 | A * | 6/1999 | Murphy | H03D 13/00 327/100 |
| 2005/0110614 | A1* | 5/2005 | Coates | G06K 19/0672 340/10.41 |
| 2007/0197180 | A1* | 8/2007 | McKinzie, III | H03H 7/40 455/248.1 |
| 2011/0086600 | A1* | 4/2011 | Muhammad | H04B 1/0458 455/120 |
| 2012/0112806 | A1* | 5/2012 | Dayi | H03L 7/089 327/145 |
| 2014/0247190 | A1* | 9/2014 | Loftus | H01Q 13/106 343/767 |
| 2014/0302797 | A1* | 10/2014 | Han | H04W 24/06 455/67.14 |
| 2015/0119052 | A1* | 4/2015 | Caimi | H01Q 5/22 455/450 |
| 2015/0133064 | A1* | 5/2015 | Horne | H04B 1/40 455/77 |

\* cited by examiner

*Primary Examiner* — Yuwen Pan
*Assistant Examiner* — Zhitong Chen
(74) *Attorney, Agent, or Firm* — Brooks, Cameron & Huebsch, PLLC

(57) ABSTRACT

Auto-tunable antenna devices and methods of using the same are described herein. One method for tuning an antenna of a device includes comparing a reference phase of a reference signal to a return phase of a return signal of the antenna and sending a correction signal to a tunable circuit element of the antenna in response to the reference phase being out of phase with the return phase.

15 Claims, 4 Drawing Sheets

AUTO-TUNABLE ANTENNA DEVICES

TECHNICAL FIELD

The present disclosure relates to auto-tunable antenna devices and methods of using the same.

BACKGROUND

Many devices include an antenna to receive and/or send data to other devices. For instance, an antenna can be used to connect to the Internet, to wirelessly communicate with other devices, to send messages, etc.

Devices with antennas can be susceptible to antenna performance degradation. For example, devices that are mobile, such as handheld devices, can be susceptible to antenna performance degradation due to the proximity of the hand, head, and/or other objects which may be held close to the radiating antenna. Antenna degradation can limit the effective communication range, and in cases of devices with automatic level control, can limit battery life due to excessive power draw of the power amplifier.

DETAILED DESCRIPTION

Figure 1:
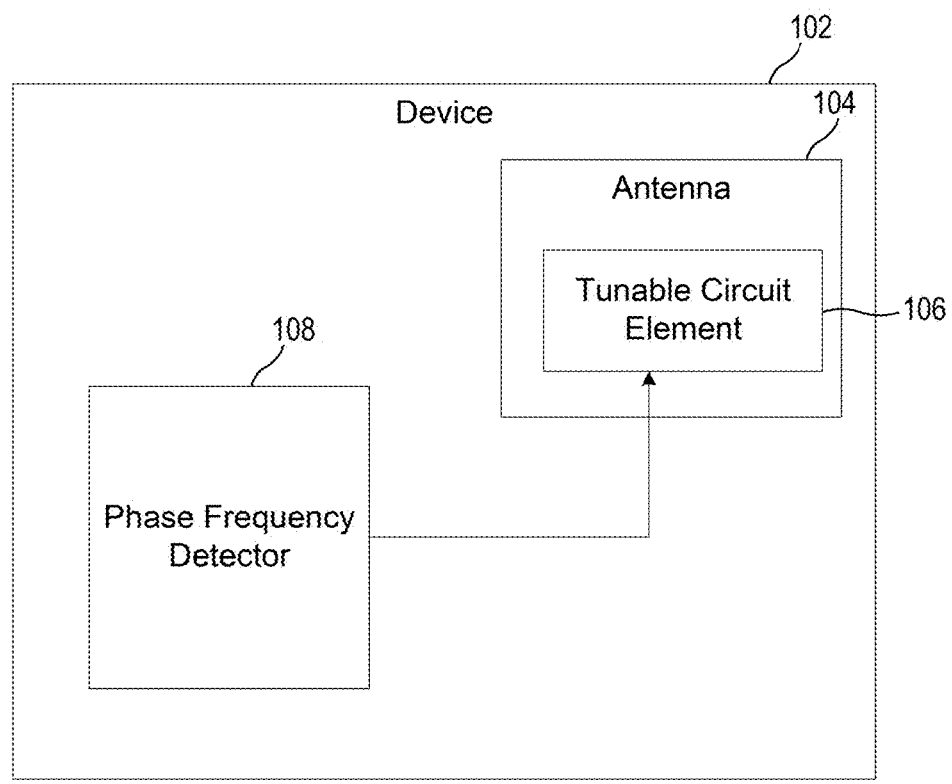
FIG. 1 illustrates an example of an auto-tunable antenna device in accordance with one or more embodiments of the present disclosure.

Embodiments of the present disclosure include auto-tunable antenna devices and methods of using the same. For example, one or more embodiments can include comparing a reference phase of a reference signal to a return phase of a return signal of an antenna, and sending a correction signal to a tunable circuit element of the antenna in response to the reference phase being out of phase with the return phase.

Devices with antennas, as previously discussed, can be susceptible to antenna performance degradation. For example, handheld devices can be susceptible to antenna performance degradation due to the proximity of the hand, head, and/or other objects which may be held close to the radiating antenna. Antenna performance degradation can include a detuned antenna. An antenna that is detuned can include a shift to a different resonant frequency than the intended resonant frequency (e.g., resonant frequency of a tuned antenna). Said differently, the antenna can shift to a different resonant frequency than the intended signal frequency.

As a particular example, a user can place a cellphone on a table. While placed on the table, the user may receive a text message from another device and/or an email over a wireless communication (e.g., Internet). Due to the proximity of the cellphone to the table, an antenna of the cellphone may detune. That is, the antenna may shift to a different resonant frequency.

Antenna degradation can limit the effective communication range, and in cases of devices with automatic level control, can limit battery life due to excessive power draw of the power amplifier. The detuning effect is pronounced on electrically small, high-Q antennas that have narrow bandwidth. The amount of detuning can be arbitrary and difficult to pre-tune in the development/production process due to the range of detuning variance. Further, a detuned antenna can cause damaging voltage levels incident to the transmit power amplifier that is a result of reflected waves from the detuned antenna.

Embodiments in accordance with the present disclosure may include auto-tunable antenna devices that automatically monitor the response of an internal antenna for detuning and apply a correction signal to tunable elements of the antenna to counteract the effects of detuning. For example, an auto-tunable antenna device can include an antenna with a tunable circuit element and a phase frequency detector. The phase frequency detector can compare a reference phase of a reference signal to a return phase of a return signal of the antenna. The reference signal can include a signal (e.g., radio frequency signal) that drives the antenna to transmit a signal. The return signal can include a reflection of a transmitted signal by the antenna.

In response to the reference phase being out of phase with the return phase, a correction signal can be sent to a tunable circuit element of the antenna. The correction signal can include a control voltage to be applied to the tunable circuit element. For example, the control voltage can drive the resonant frequency of the antenna to tune the antenna. The phase frequency detector can continuously compare and send correction signals to dynamically tune the antenna over time. That is, embodiments in accordance with the present disclosure can include continuously monitoring and adjusting the resonant frequency of an antenna to dynamically tune the antenna over time.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 208 in FIG. 2.

As used herein, "a" or "a number of" something can refer to one or more such things. For example, "a number of antennas" can refer to one or more antennas.

FIG. 1 illustrates an example of an auto-tunable antenna device in accordance with one or more embodiments of the present disclosure. For example, the auto-tunable antenna device 102 can self-tune without human intervention.

As illustrated by FIG. 1, the auto-tunable antenna device 102 can include an antenna 104. An antenna, as used herein, is an electrical device which converts electric currents into radio waves, and/or vice versa. For example, an antenna can receive a signal and produce a voltage at its terminal that can be applied to a receiver to be amplified. Example antennas can include a primary cellular antenna, a diversity cellular antenna, global position system (GPS) antenna, a local area wireless (WIFI) antenna, a short wavelength radio wave antenna, a near field communication (NFC) antenna, etc.

Although the embodiment of FIG. 1 illustrates a single antenna, embodiments in accordance with the present disclosure are not so limited. For example, an auto-tunable antenna device can include a plurality of antennas. One or more of the plurality of antennas can be tunable.

The antenna 104 can include a tunable antenna. That is, the resonant frequency of the antenna 104 can be shifted. For example, the antenna 104 can include a tunable circuit element 106. A tunable circuit element 106 can include a hardware component on a logic circuit that can shift the resonant frequency of the antenna 104 in response to a voltage applied to it.

The auto-tunable antenna device 102 can include a phase frequency detector (PFD) 108. A PFD 108 is a device that compares a phase of two signals. A phase of a signal, as used herein, is a point in a cycle of the wave of the signal. That is, a phase of a signal is a fraction of a wave cycle that has elapsed relative to the start of the wave cycle.

For example, the PFD 108 can compare a phase of a reference signal to a phase of a return signal. The reference signal, as used herein, can include a signal (e.g., radio frequency signal) that drives the antenna 104 to transmit a signal. The return signal, as used herein, can include a reflection of the transmitted signal 104. For example, when a signal is transmitted by the antenna 104, the antenna 104 can reflect a portion of the transmitted signal.

That is, the reference signal and the return signal can be captured from a signal transmitted by the antenna 104 of the device 102. One or more of the reference signal and the return signal can be amplified using an amplifier, in various embodiments.

With a tuned antenna, the reference signal is 180 degrees out of phase with the return signal. Thereby, a reference phase of the reference signal can be out of phase with the return signal in response to the reference phase of the reference signal being greater or less than a threshold value from 180 degrees different than the return phase of the return signal, and/or vice versa.

In accordance with embodiments of the present disclosure, to compare the phases, at least one of the phases can be shifted 180 degrees prior to the comparison. For example, the auto-tunable antenna device 102 can include a phase shifter. A phase shifter, as used herein, is a hardware component on a logic circuit that can change a phase of a signal. For example, a phase shift can delay a wave to shift the phase of the signal.

The phase shifter can shift one of the phases of the reference signal and the return signal of the antenna 104 a threshold degree. For example, the phase shifter can shift one of the two phases 180 degrees, such that the phase of the reference signal and the phase of the return signal are the same (e.g., zero degrees out of phase) and/or within a threshold degree of the same when the antenna 104 is tuned.

The PFD 108 can output a correction signal to the tunable circuit element 106 of the antenna 104. The correction signal can be sent to the tunable circuit element 106 in response to the reference phase being out of phase with the return phase (e.g., exceeding a threshold value from 180 degrees or a threshold value from zero degrees).

The correction signal can include a control voltage. A control voltage can include an analog voltage that can drive the resonant frequency of a tunable element. The control voltage can be applied to the tunable circuit element 106. For example, the control voltage can drive the resonant frequency of the antenna 104 to tune the antenna 104. That is, the control voltage can force the return phase of the return signal to be in phase with the reference phase of the reference signal.

The tunable circuit element 106 can be controlled by an output of the PFD 108. For example, the tunable circuit element 106 can be a varactor. A varactor is a diode that user a p-n junction in reverse bias and has a structure such that the capacitance of the varactor varies with the reverse voltage. For example, the varactor can be under analog control by an output of a PFD 108.

Alternatively, the tunable circuit element 106 can be a digitally-programmable capacitor. The voltage output of the PFD 108, in such embodiments, can be digitized, processed, and sent to the digitally-programmable capacitor.

In various embodiments, the auto-tunable antenna device 102 can include a microcontroller. A microcontroller, as used herein, can include a computing device and/or single integrated circuit containing a processor core, memory, and/or programmable input/output peripherals. The microprocessor can control the auto-tunable antenna device 102 to provide antenna tuning at specific times and/or periodically.

Alternatively and/or in addition, the PFD 108 can continuously compare phases and send correction signals to dynamically tune the antenna 104 over time. For example, the PFD 108 can compare a return phase to a reference phase multiple times. For each comparison, the PFD 108 can send a correction signal to the tunable circuit element 106 of the antenna 104 to tune the antenna 104.

The auto-tunable antenna device 102 illustrated by FIG. 1 can be used to implement a variety of methods. One such method can include comparing a phase of a reference signal to a phase of a return signal of the antenna, and sending a correction signal to a tunable circuit element of the antenna in response to the phase of the reference signal being out of phase with the phase of the return signal.

Figure 2:
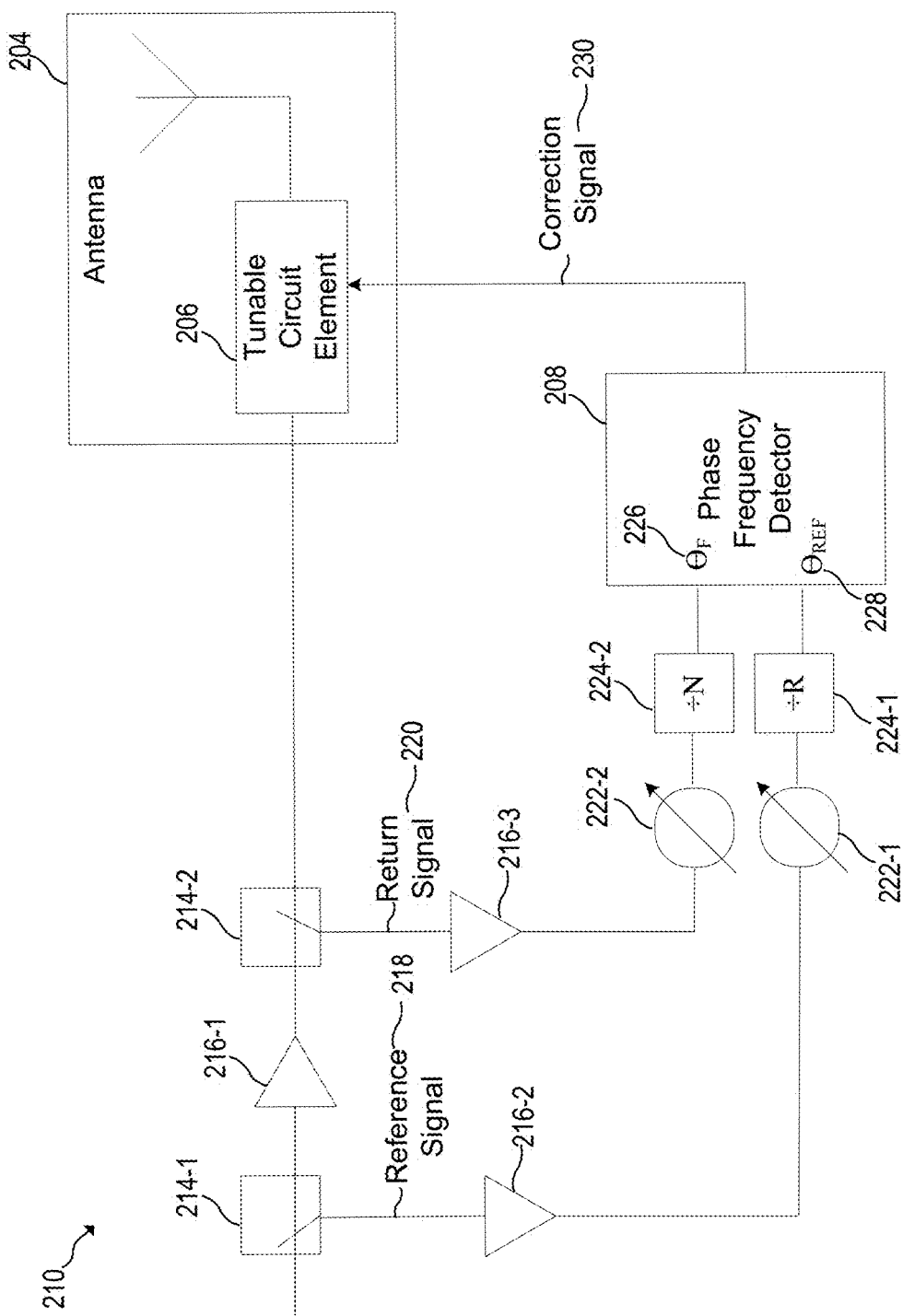
FIG. 2 illustrates an example of a logic circuit of an auto-tunable antenna device in accordance with one or more embodiments of the present disclosure.

FIG. 2 illustrates an example of a logic circuit of an auto-tunable antenna device in accordance with one or more embodiments of the present disclosure. The auto-tunable antenna device illustrated in FIG. 2, in some embodiments, can include the auto-tunable antenna device 102 illustrated in FIG. 1.

The logic circuit 210 of the auto-tunable antenna device, in various embodiments, can include an antenna 204 including a tunable circuit element 206, a phase shifter 222-1, 222-2, and a PFD 208, as previously discussed in connection with FIG. 1. The antenna 204, as illustrated by FIG. 2, can include a tunable antenna.

The antenna 204 can be coupled to a number of directional couplers 214-1, 214-2. A directional coupler can include a hardware component that divides a signal. For example, a directional coupler can direct a portion of a signal to a different part of the logic circuit 210.

The antenna 204 can transmit a signal in response to a reference signal. The reference signal can include the signal (e.g., radio frequency signal/power) that drives the antenna 204 to transmit a signal. That is, the antenna 204 can be driven to transmit a signal by a reference signal from an amplifier 216-1. A reference phase of the reference signal can be coupled to the logic circuit via a first directional coupler 214-1. The first directional coupler 214-1 can direct a portion of the reference signal 218 to the PFD 208.

Using the reference signal, the antenna 204 can transmit a signal and reflect a portion of the transmitted signal as a return signal 220. The return signal 220 can be 180 degrees out of phase with the reference signal 218. The return phase of the return signal 220 can be coupled to the logic circuit 210 via a second directional coupler 214-2. The second directional coupler 214-2 can direct a portion of the return signal 220 to the PFD 208.

Due to the electrical path lengths, amplifiers, etc., present in the logic circuit 210, at least one phase shifter 222-1, 222-2 can be present on the logic circuit 210. A phase shifter can be a coaxial cable, for example.

The at least one phase shifters 221-1, 222-2 can be used to adjust a phase of one of the return signal 220 or the reference signal 218 such that the inputs to the PFD 208 are in phase when antenna 204 is tuned. Said differently, when the antenna 204 is tuned, the return phase and reference phase are in phase (e.g., the same value and/or within a threshold degree of the same value) and not a 180 degrees out of phase.

Although the embodiment of FIG. 2 illustrates two phase shifters, only one phase shifter may exist and/or may be utilized. For example, a first phase shifter 221-1 can shift the reference phase of the reference signal 218 by 180 degrees. Alternatively, the second phase shifter 221-2 can shift the return phase of the return signal 220 by 180 degrees.

As illustrated by FIG. 2, in some embodiments, the frequency of operation of the antenna 204 may be a greater frequency than the PFD 208 can accept. In such embodiments, the logic circuit 210 can include one or more frequency dividers 224-1, 224-2. A frequency divider, as used herein, is a hardware component that can divide input frequency of a signal. The frequency dividers 224-1, 224-2 can divide the frequency such that the frequencies are compatible with the PFD 208. Phase information is typically preserved upon frequency division such that proper PFD operation is maintained.

For example, the frequency dividers 224-1, 224-2 can divide the frequency of the signals, respectively, to output a frequency range accepted by the PFD 208. Further, the undivided phase can be retained by the PFD 208 for sending an appropriate correction signal. Although the frequency dividers 224-1, 224-2 are illustrated as separate electrical hardware components, in some embodiments, the frequency dividers 224-1, 224-2 can be a component of the PFD 208.

The return signal 220 and reference signal 218 are input to the PFD 208. For example, the PFD 208 can compare the reference phase $\theta_{REF}$ 228 of the reference signal 218 to the return phase $\theta_F$ 226 of the return signal 220.

Further, in some embodiments, the PFD 208 can identify if the reference phase $\theta_{REF}$ 228 is out of phase with the return phase $\theta_F$ 226. The respective phases can be out of phase in response to the reference phase 218 not being 180 degrees out of phase with the return phase 220.

In order for the PFD 208 to make the identification, one of the phases can be shifted using a phase shifter. In such embodiments, the phases can be out of phase in response to the reference phase 218 not being within a threshold degree of the return phase 220. That is, a tuned antenna 204 can result in a reference phase 218 being in phase with a return phase 220, where one of the phases is shifted 180 degrees prior to the comparison.

In response to the reference phase 218 being out of phase with the return phase 220, the PFD 208 can send a correction signal 230 to the tunable circuit element 206 of the antenna 204. The correction signal 230 can include a control voltage to be applied to the tunable circuit element 206.

For example, in various embodiments, the tunable circuit element 206 of the antenna 204 can apply the control voltage to tune the antenna 204 of the device in response to receiving the correction signal 230. The control voltage can drive the resonant frequency of the antenna 204 to a state in which the phase is back to a tuned value.

In a number of embodiments, the logic circuit 210 can include a number of amplifiers 216-1, 216-2, 216-3. The amplifiers 216-1, 216-2, 216-3 can be used to amplify various signals. For example, a first amplifier 216-1 can be used to generate a radio frequency signal to drive the antenna 204 to transmit a signal. A second amplifier 216-2 can be used, in some embodiments, to amplify the portion of the reference signal 218 directed by the first directional coupler 214-1. Alternatively and/or in addition, a third amplifier 216-3 can amplify the portion of the return signal 220 directed by the second directional coupler 214-2. That is, the second and third amplifiers 216-2, 216-3 can include gain amplifiers.

The auto-tunable antenna device of FIG. 2 can include an analog system. The antenna 204 can be continuously tuned as the analog voltage is continuously circulated to compare phases of signals and send correction signals.

Figure 3:
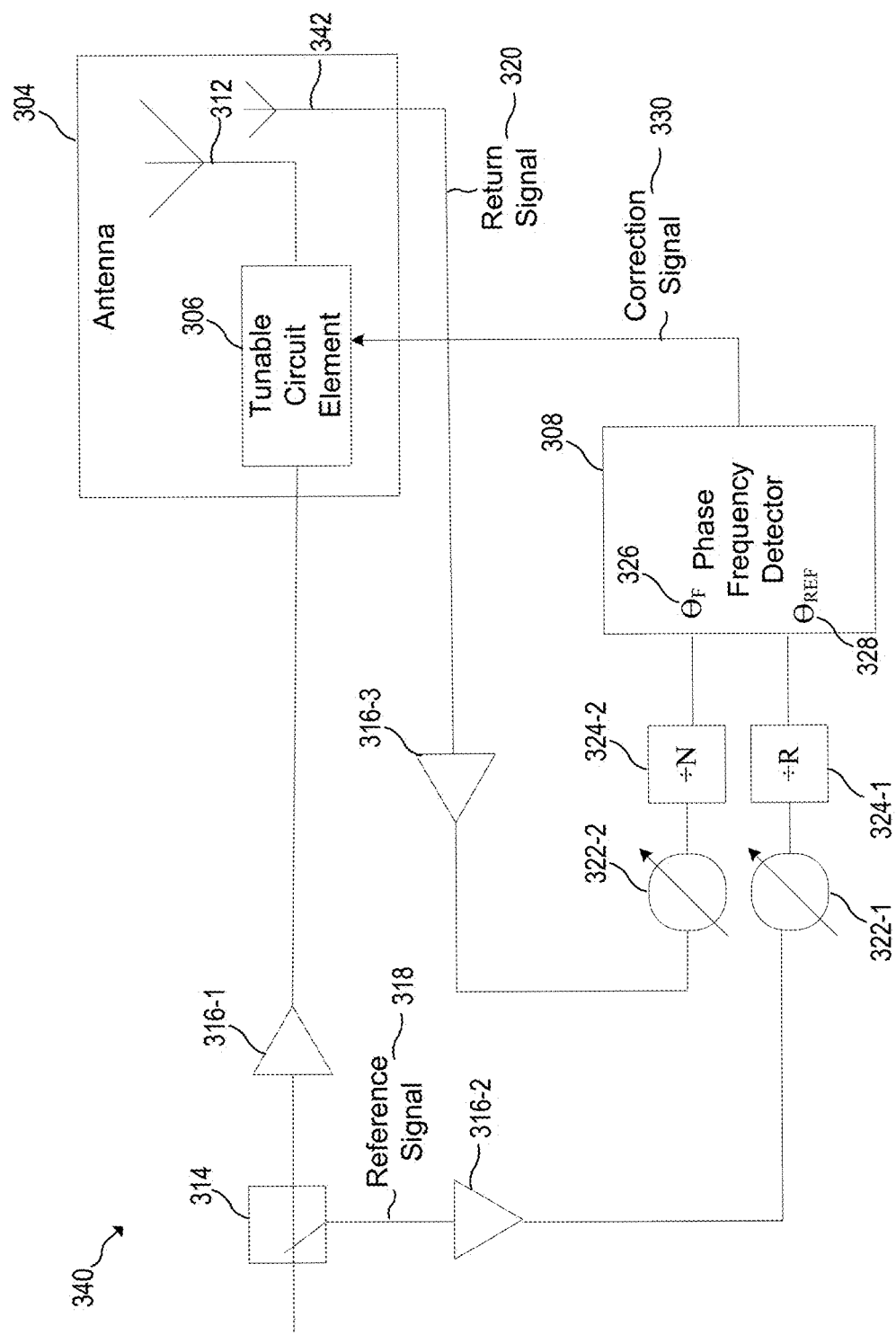
FIG. 3 illustrates an example of a logic circuit of an auto-tunable antenna device in accordance with one or more embodiments of the present disclosure.

FIG. 3 illustrates an example of a logic circuit of an auto-tunable antenna device in accordance with one or more embodiments of the present disclosure.

Similarly to FIG. 2, the logic circuit 340 of the auto-tunable antenna device, as illustrated by FIG. 3, can include an antenna 304 including a tunable circuit element 306, a phase shifter 322-1, 322-2, and a PFD 308, as previously discussed in connection with FIGS. 1-2.

The antenna 304, as illustrated by FIG. 3, can include two antennas 312, 342. The first antenna 312 can be a tunable antenna. A tunable antenna, as used herein, is an antenna that is auto-tuned by the auto-tunable antenna device. The second antenna 342 can be an integrated sensor antenna to capture a return signal 320. That is, the second antenna 342 can monitor the tunable antenna 312. An example second antenna 342 can include a NFC antenna.

The second antenna 342 can be designed into the auto-tunable antenna device in proximity to the first antenna 312 such that, under tuned conditions, the phase of the return signal 320 captured by the second antenna 342 is 180 degrees out of phase with the reference phase of the reference signal 318. That is, the second antenna 342 can be 180 degrees out of phase with the reference phase of the reference signal 318.

The antenna 304 can be coupled to a directional coupler 314. For example, a directional coupler can direct a portion of a signal to a different part of the logic circuit 340.

The antenna 304 can transmit a signal in response to a reference signal. That is, the antenna 304 can be driven to transmit a signal by a reference signal from an amplifier 316-1. A reference phase of the reference signal 318 can be coupled to the logic circuit 340 via a directional coupler 314. The directional coupler 314 can direct a portion of the reference signal 318 to the PFD 308.

Using the reference signal, the antenna 304 can transmit a signal and reflect a portion of the transmitted signal as a return signal 320. The second antenna 342 of the antenna 304 can capture the return signal 320. The return signal 320 can be 180 degrees out of phase with the reference signal 318.

Due to the electrical path lengths, amplifiers, etc., present in the logic circuit 340, at least one phase shifter 322-1, 322-2 can be present on the logic circuit 340. The at least one phase shifters 321-1, 322-2 can be used to adjust a phase of one of the return phase 320 or the reference phase 318 such that the inputs to the PFD 308 are in phase. Said differently, when the antenna 304 (e.g., the tunable antenna 312) is tuned, the input return phase and reference phase are in phase (e.g., the same value and/or within a threshold degree of the same value) and not a 180 degrees out of phase.

Although the embodiment of FIG. 3 illustrates two phase shifters, only one phase shifter may exist and/or may be utilized.

As previously discussed, in some embodiments, the frequency of operation of the antennas 312, 342 may be a greater frequency than the PFD 308 can accept. In such embodiments, the logic circuit 340 can include one or more frequency dividers 324-1, 324-2.

For example, the frequency dividers 324-1, 324-2 can divide the frequency of the phases, respectively, to output a frequency range accepted by the PFD. Although the frequency dividers 324-1, 324-2 are illustrated as separate electrical hardware components, in some embodiments, the frequency dividers 324-1, 324-2 can be a component of the PFD 308.

The return signal 320 and reference signal 312 are input to the PFD 308. For example, the PFD 308 can compare the reference phase $\theta_{REF}$ 328 of the reference signal 318 to the return phase $\theta_F$ 326 of the return signal 320. Further, the PFD 308 can identify the reference phase $\theta_{REF}$ 328 is out of phase with the return phase $\theta_F$ 326.

In order for the PFD 308 to make the identification, one of the phases can be shifted using a phase shifter 322-1, 322-2. In such embodiments, the phases can be out of phase in response to the reference phase 328 not being within a threshold degree of the return phase 326. That is, a tuned antenna 304 can result in a reference phase 328 being in phase with a return phase 326, where one of the phases is shifted 180 degrees prior to the comparison.

In response to the reference phase 328 being out of phase with the return phase 326, the PFD 308 can send a correction signal 330 to the tunable circuit element 306 of the antenna 304. The correction signal 330 can include a control voltage to be applied to the tunable circuit element 306. Further, the tunable circuit element 306 of the antenna 304 can apply the control voltage to tune the antenna 304 of the device in response to receiving the correction signal 330.

In a number of embodiments, the logic circuit 340 can include a number of amplifiers 316-1, 316-2, 316-3. The amplifiers can be used to amplify various signals. For example, a first amplifier 316-1 can be used to generate a radio frequency signal to drive the antenna 304 to transmit a signal. A second amplifier 316-2 can be used, in some embodiments, to amplify the portion of the reference signal 318 directed by the directional coupler 314. Alternatively and/or in addition, a third amplifier 316-3 can amplify the portion of the return signal 320 captured by the second antenna 342.

Figure 4:
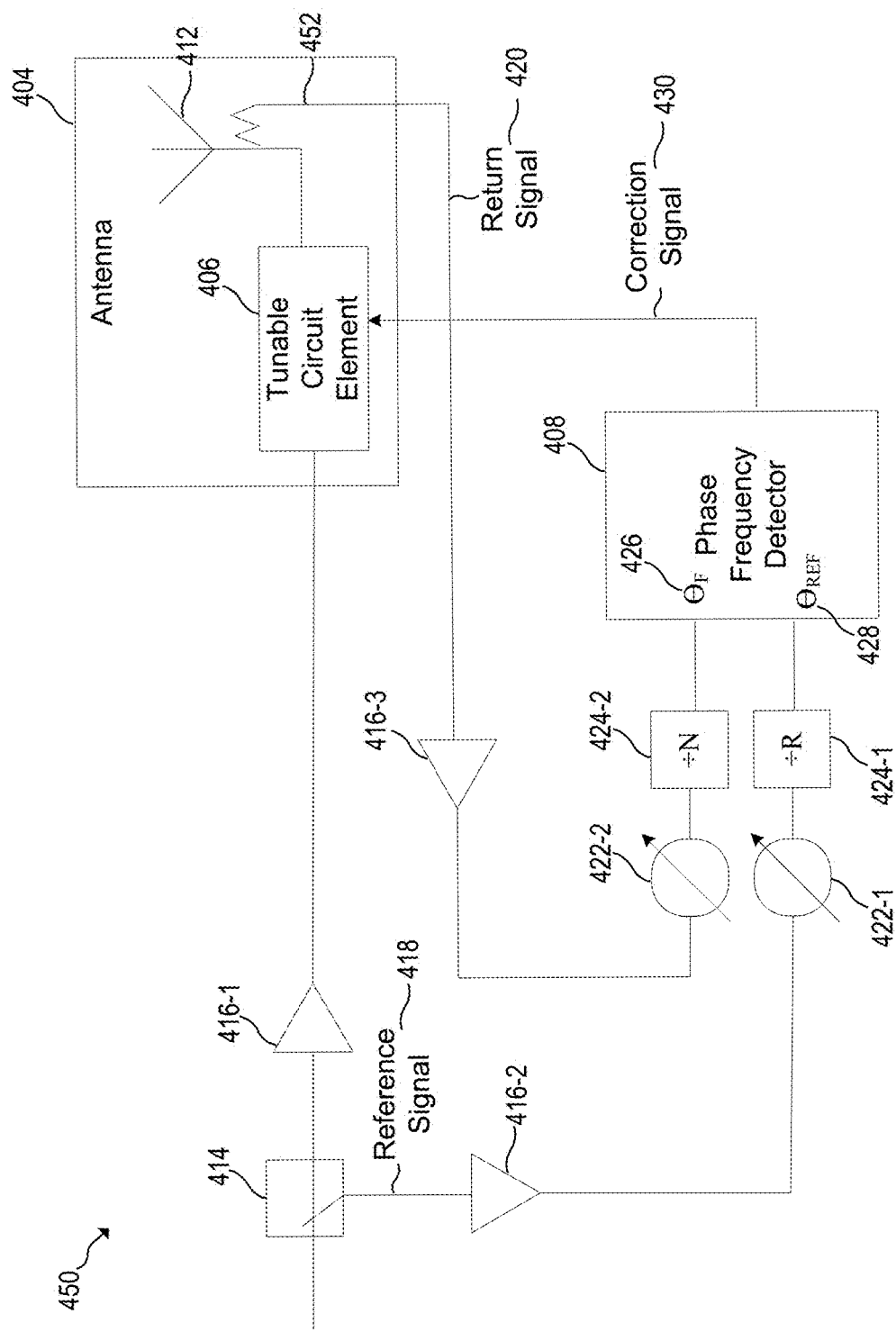
FIG. 4 an example of a logic circuit of an auto-tunable antenna device in accordance with one or more embodiments of the present disclosure.

FIG. 4 an example of a logic circuit of an auto-tunable antenna device in accordance with one or more embodiments of the present disclosure.

Similarly to FIGS. 2 and 3, the logic circuit 450 of the auto-tunable antenna device, as illustrated by FIG. 4, can include an antenna 404 including a tunable circuit element 406, a phase shifter 422-1, 422-2, and a PFD 408, as previously discussed in connection with FIGS. 1-3.

The antenna 404, as illustrated by FIG. 4, can include a tunable antenna 412. Further, the antenna 404 can include an integrated resistor 452. The integrated resistor 452 can be attached to the antenna 404, for example. The integrated resistor 452 can capture a return signal 420. For example, the integrated resistor 452 can be a threshold value resistor to pull signal from the reflection of the tunable antenna 412 so that the integrated resistor 452 captures a small portion of the return signal 420 with minimal power output degradation by the tunable antenna 412. The return signal 420 can be amplified by an amplifier (e.g., amplifier 416-3), as further discussed herein.

The integrated resistor 452 can be designed into the auto-tunable antenna device in proximity to the tunable antenna 412 such that, under tuned conditions, the phase of the return signal 420 captured by the integrated resistor 452 is 180 degrees out of phase with the reference phase of the reference signal 418.

The antenna 404 (e.g., the tunable antenna 412) can transmit a signal in response to a reference signal. The reference signal can include the signal (e.g., radio frequency signal) that drives the antenna 404 to transmit a signal. That is, the antenna 404 can be driven to transmit a signal by a reference signal from an amplifier 416-1. A reference phase of the reference signal 418 can be coupled to the logic circuit 450 via a directional coupler 414. The directional coupler 414 can direct a portion of the reference signal 418 to the PFD 408.

Using the reference signal, the antenna 404 can transmit a signal and reflect a portion of the transmitted signal as a return signal 420. The integrated resistor 452 of the antenna 404 can capture a portion of the return signal 420. The return signal 420 can be 180 degrees out of phase with the reference signal 418.

Due to the electrical path lengths, amplifiers, etc., present in the logic circuit 450, at least one phase shifter 422-1, 422-2 can be present on the logic circuit 450. The at least one phase shifter 421-1, 422-2 can be used to adjust a phase of one of the return phase or the reference phase such that the inputs to the PFD 408 are in phase. Said differently, when the tunable antenna 412 is tuned, the input return phase and reference phase are in phase (e.g., the same value and/or within a threshold degree of the same value) and not a 180 degrees out of phase. Although the embodiment of FIG. 4 illustrates two phase shifters, only one phase shifter may exist and/or may be utilized.

As previously discussed, in some embodiments, the frequency of operation of the antenna 404 (e.g., the tunable antenna 412) and/or the integrated resistor 452 may be a greater frequency than the PFD 408 can accept. In such embodiments, the logic circuit 450 can include one or more frequency dividers 424-1, 424-2.

For example, the frequency dividers 424-1, 424-2 can divide the frequency of the signals, respectively, to output a frequency range accepted by the PFD 408. Although the frequency dividers 424-1, 424-2 are illustrated as separate electrical hardware components, in some embodiments, the frequency dividers 424-1, 424-2 can be a component of the PFD 408.

The return signal 420 and reference signal 418 are input to the PFD 408. For example, the PFD 408 can compare the reference phase $\theta_{REF}$ 428 of the reference signal 418 to the return phase $\theta_F$ 426 of the return signal 420. Further, the PFD 408 can identify the reference phase $\theta_{REF}$ 428 is out of phase with the return phase $\theta_F$ 426.

In order for the PFD 408 to make the identification, one of the phases can be shifted using a phase shifter. In such embodiments, the phases can be out of phase in response to the reference phase 428 not being within a threshold degree of the return phase 426. That is, a tuned antenna 404 can result in a reference phase 428 being in phase with a return phase 426, where one of the phases is shifted 180 degrees prior to the comparison.

In response to the reference phase 428 being out of phase with the return phase 426, the PFD 408 can send a correction signal 430 to the tunable circuit element 406 of the antenna 404. The correction signal 430 can include a control voltage to be applied to the tunable circuit element 406. The tunable circuit element 406 of the antenna 404 can apply the control voltage to tune the antenna 404 of the device in response to receiving the correction signal 430.

In some embodiments, the logic circuit 450 can include a number of amplifiers 416-1, 416-2, 416-3. The amplifiers can be used to amplify various signals. For example, a first amplifier 416-1 can be used to generate a radio frequency signal to drive the antenna 404 (e.g., the tunable antenna 412) to transmit a signal. A second amplifier 416-2 can be used, in some embodiments, to amplify the portion of the reference signal 418 directed by the directional coupler 414. Alternatively and/or in addition, a third amplifier 416-3 can amplify the portion of the return signal 420 captured by the integrated resistor 452.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for tuning an antenna of a device, comprising:
    determining that an antenna has performance degradation, wherein performance degradation includes a detuned antenna created by a shift to a different signal frequency than an intended signal frequency, by using a phase frequency detector to compare a reference phase of a portion of a reference signal of the antenna to a return phase of a portion of a return signal of the antenna, wherein a first directional coupler electrically connected to the antenna directs the portion of the reference signal to the phase frequency detector and a second directional coupler electrically connected to the antenna directs the portion of the return signal to the phase frequency detector and wherein a first frequency divider electrically connected between the first directional coupler and the phase frequency detector divides the reference phase of the portion of the reference signal and a second frequency divider electrically connected between the second directional coupler and the phase frequency detector divides the return phase of the portion of the return signal; and
    sending a correction signal, including an analog control voltage, to a tunable circuit element of the antenna in response to the reference phase being out of phase with the return phase, wherein an undivided reference phase of the portion of the reference signal and an undivided return phase of the portion of the return signal are retained by the phase frequency detector for sending the correction signal.

2. The method of claim 1, including capturing the reference signal and the return signal from a signal transmitted by the antenna of the device.

3. The method of claim 1, including identifying the reference phase is out of phase with the return phase, wherein out of phase includes exceeding a threshold value from 180 degrees out of phase.

4. The method of claim 1, including shifting one of the reference phase and the return phase 180 degrees, wherein out of phase includes exceeding a threshold value from 0degrees out of phase.

5. The method of claim 1, including amplifying at least one of the reference signal and the return signal using an amplifier.

6. The method of claim 5, including driving a resonant frequency of the antenna to tune the antenna using the analog control voltage.

7. A device including:
    an antenna including a tunable circuit element, wherein the antenna has performance degradation due to the antenna being detuned by the antenna shifting to a different resonant frequency than an intended signal frequency; and
    a phase frequency detector to:
        compare a reference phase of a portion of a reference signal of the antenna to a return phase of a portion of a return signal of the antenna to determine whether performance degradation is occurring, wherein a first directional coupler electrically connected to the antenna directs the portion of the reference signal received from the antenna to the phase frequency detector and a second directional coupler electrically connected to the antenna directs the portion of the return signal to the phase frequency detector and wherein a first frequency divider electrically connected between the first directional coupler and the phase frequency detector divides the reference phase of the portion of the reference signal and a second frequency divider electrically connected between the second directional coupler and the phase frequency detector divides the return phase of the portion of the return signal;

if performance degradation is occurring identify the reference phase is out of phase with the return phase; and, in response, send a correction signal, including an analog control voltage, to the tunable circuit element of the antenna, wherein an undivided reference phase of the portion of the reference signal and an undivided return phase of the portion of the return signal are retained by the phase frequency for sending the correction signal.

8. The device of claim 7, wherein the antenna includes a tunable antenna.

9. The device of claim 7, wherein an integrated resistor is 180degrees out of phase with the reference phase of the reference signal.

10. The device of claim 7, wherein the device is under microcontroller control to provide antenna tuning at specified periods of time.

11. A device including:

an antenna including a tunable circuit element, wherein the antenna has performance degradation due to the antenna being detuned by the antenna shifting to a different resonant frequency than an intended signal frequency;

a phase shifter to shift at least one of a reference phase of a portion of a reference signal and a return phase of a portion of a return signal of the antenna a threshold degree; and a phase frequency detector to:

compare the reference phase of the portion of the reference signal to the return phase of the portion of the return signal to determine whether performance degradation is occurring, wherein a first directional coupler electrically connected to the antenna directs the portion of the reference signal to a phase frequency detector and a second directional coupler electrically connected to the antenna directs the portion of the return signal to the phase frequency detector and wherein a first frequency divider electrically connected between the first directional coupler and the phase frequency detector divides the reference phase of the portion of the reference signal and a second frequency divider electrically connected between the second directional coupler and the phase frequency detector divides the return phase of the portion of the return signal;

if performance degradation is occurring identify the reference phase is out of phase with the return phase; and, in response, send a correction signal to the tunable circuit element of the antenna;

wherein the tunable circuit element applies an analog control voltage to tune the antenna of the device in response to receiving the correction signal and wherein an undivided reference phase of the portion of the reference signal and an undivided return phase of the portion of the return signal are retained by the phase frequency detector for sending the correction signal.

12. The device of claim 11, wherein the correction signal includes the analog control voltage.

13. The device of claim 11, wherein the first frequency divider divides the reference phase of the portion of the reference signal and the second frequency divider divides the return phase of the portion of the return signal to provide a frequency range that is accepted by the phase frequency detector.

14. The device of claim 11, wherein the tunable circuit element is a varactor that is under analog control by correction signal of the phase frequency detector.

15. The device of claim 11, wherein the tunable circuit element is a digitally-programmed capacitor, and the correction signal is digitized and sent to the digitally-programmed capacitor.

* * * * *